(12) United States Patent  (10) Patent No.: US 8,451,681 B2
Maejima  (45) Date of Patent: May 28, 2013

(54) SEMICONDUCTOR STORAGE DEVICE INCLUDING MEMORY CELLS EACH HAVING A VARIABLE RESISTANCE ELEMENT

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/309,334

(22) Filed: Dec. 1, 2011

(65) Prior Publication Data

US 2012/0075915 A1   Mar. 29, 2012

Related U.S. Application Data

(63) Continuation of application No. 12/510,798, filed on Jul. 28, 2009, now Pat. No. 8,094,477.

(30) Foreign Application Priority Data

Jul. 30, 2008   (JP) .................................. 2008-196366

(51) Int. Cl.
G11C 8/08 (2006.01)
G11C 13/00 (2006.01)
G11C 11/408 (2006.01)

(52) U.S. Cl.
CPC ........ *G11C 11/4087* (2013.01); *G11C 13/0002* (2013.01)
USPC ................. 365/230.06; 365/189.09; 365/148; 365/158; 365/163; 365/171

(58) Field of Classification Search
USPC ............... 365/189.09, 230.06, 148, 158, 163
See application file for complete search history.

(56) References Cited

U.S. PATENT DOCUMENTS

2007/0058425 A1   3/2007   Cho et al.
2008/0112209 A1   5/2008   Cho et al.

FOREIGN PATENT DOCUMENTS

| JP | 2005-522045 | 7/2005 |
| JP | 2007-73176 | 3/2007 |
| JP | 2008-077697 | 4/2008 |
| KR | 10-0827697 | 4/2008 |

OTHER PUBLICATIONS

Office Action issued Jan. 20, 2011 in Korean Application No. 10-2009-69284 (w/English translation).
Japanese Office Action issued Jun. 5, 2012, in Japan Patent Application No. 2008-196366 (with English translation).

*Primary Examiner* — Kretelia Graham
(74) *Attorney, Agent, or Firm* — Oblon, Spivak, McClelland, Maier & Neustadt, L.L.P.

(57) ABSTRACT

A semiconductor storage device includes a memory cell array having memory cells positioned at respective intersections between a plurality of first wirings and a plurality of second wirings, each of the memory cells having a rectifier element and a variable resistance element connected in series, and a control circuit selectively driving the first and second wirings. The control circuit applies a first voltage to the selected first wiring and applies a second voltage to the selected second wiring to apply a certain potential difference to a selected memory cell positioned at a intersection between the selected first and second wirings, and brings at least one of nonselected first wirings into a floating state.

12 Claims, 9 Drawing Sheets

Column Switch 20

ONLY SELECTED BIT LINE BL IS SET AT VSET, OTHER NONSELECTED BIT LINES BL ARE SET AT Vss=0V

Column decoder 21

Sense Amp & Write Buffer 22

IN SET OPERATEION OR RESET OPERATION, SWITCH SW1 TURN ON

IN READ OPERATEION, SWITCH SW2 TURN ON

VCol Driver 23

SEMICONDUCTOR STORAGE DEVICE INCLUDING MEMORY CELLS EACH HAVING A VARIABLE RESISTANCE ELEMENT

CROSS REFERENCE TO RELATED APPLICATIONS

This application is a continuation of and claims the benefit of priority under 35 U.S.C. §120 from U.S. Ser. No. 12/510,798 filed Jul. 28, 2009, and claims the benefit of priority under 35 U.S.C. §119 from Japanese Patent Application No. 2008-196366 filed Jul. 30, 2008, the entire contents of each of which are incorporated herein by reference.

BACKGROUND OF THE INVENTION

1. Field of the Invention

The present invention relates to a semiconductor storage device, and in particular, to a semiconductor storage device with a structure where memory cell arrays are laminated on the semiconductor substrate.

2. Description of the Related Art

In recent years, an attention is paid to resistance change memories as subsequent candidates of flash memories. The resistive memory devices include narrowly-defined Resistive RAM (ReRAM) and Phase Change RAM (PCRAM). The Resistive RAM store resistance states in a nonvolatile manner with transition metal oxide being used as a recording layer. The Phase Change RAM use chalcogenide as a recording layer and utilize resistance information of crystalline state (conductor) and amorphous state (insulator).

Variable resistance elements of the resistive memories have two kinds of operating modes. One of them is called a bipolar type such that polarity of an applied voltage is switched and thus a high resistant state and a low resistant state are set. The other one is called as a unipolar type such that a voltage value and voltage applying time are controlled without switching the polarity of an applied voltage, and thus the high resistant state and the low resistant state can be set.

In order to realize high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity may be achieved without an increase in cell array area by arranging such memory cell arrays laminated in a three-dimensional manner (see, Japanese Unexamined Patent Publication No. (Kohyo) 2005-522045).

Generally in the semiconductor storage devices, a bit line of a memory cell array is connected to a column control circuit including a column decoder and a sense amplifier. A word line of the memory cell array is connected to a row control circuit including a row decoder and a word line driver. In semiconductor storage devices having cross-point type memory cell arrays, the bit line and the word line connected to a selected memory cell are controlled by the column control circuit and the row control circuit, so that an operation for writing/reading data into/from the selected memory cell is performed. Japanese Patent Application Laid-Open No. 2008-077697 describes a control circuit which selectively drives wirings connected to memory cell arrays in a semiconductor storage device. This control circuit is constituted so that two transistors are connected in series, wiring is selected based on a decoder signal, and a high voltage is applied to the selected wiring and a low voltage is applied to nonselected wirings.

In resistive memory devices having a memory block where memory cell arrays are laminated, in order to reduce an entire chip size, a control circuit is occasionally arranged on a semiconductor substrate below the memory block. In order to arrange the control circuit within an area below the memory block, a circuit area of the control circuit should be reduced. For this reason, it is required to simplify the configuration of the control circuit for selectively driving the wirings connected to the memory cell arrays.

SUMMARY OF THE INVENTION

A semiconductor storage device according to one aspect of the present invention includes: a memory cell array having memory cells positioned at respective intersections between a plurality of first wirings and a plurality of second wirings, each of the memory cells having a rectifier element and a variable resistance element connected in series; and a control circuit selectively driving the first and second wirings, the control circuit applying a first voltage to the selected first wiring and applying a second voltage to the selected second wiring to apply a certain potential difference to a selected memory cell positioned at a intersection between the selected first and second wirings, and bringing at least one of nonselected first wirings into a floating state.

A semiconductor storage device according to another aspect of the present invention includes: a memory cell array having memory cells positioned at respective intersections between a plurality of first wirings and a plurality of second wirings, each of the memory cells having a rectifier element and a variable resistance element connected in series; and a control circuit selectively driving the first and second wirings, the control circuit applying a first voltage to the selected first wiring and applying a second voltage to the selected second wiring to apply a certain potential difference to a selected memory cell positioned at a intersection between the selected first and second wirings, bringing some of nonselected first wirings into a floating state, and applying a second voltage to the other nonselected first wirings.

A semiconductor storage device according to still another aspect includes: a memory cell array having memory cells positioned at respective intersections between a plurality of first wirings and a plurality of second wirings, each of the memory cells having a rectifier element and a variable resistance element connected in series; and a control circuit selectively driving the first and second wirings, the control circuit including first data lines to which a first voltage or a second voltage is applied, second data lines to which a the first voltage or the second voltage is applied, and a first wiring selecting section comprising one transistor connected between the first data lines or the second data lines and the first wirings, the control circuit applying a first voltage to the selected first wiring and applying a second voltage to the selected second wiring to apply a certain potential difference to a selected memory cell positioned at a intersection between the selected first and second wirings, the first wiring selecting section being conductive to apply the first voltage from the first or second data line to the first wiring when the first wiring is selected, and not being conductive to bring at least one of the first wirings into a floating state when the first wirings are not selected.

DETAILED DESCRIPTION OF THE EMBODIMENTS

Embodiments of the present invention will now be described below with reference to the accompanying drawings. In the disclosed embodiments, a semiconductor storage device is described as a resistive memory device having a three-dimensional memory cell array structure with laminated memory cell arrays. Of course, this configuration, however, is intended to be exemplary only, and not a limitation upon the present invention.

First Embodiment

Figure 1:
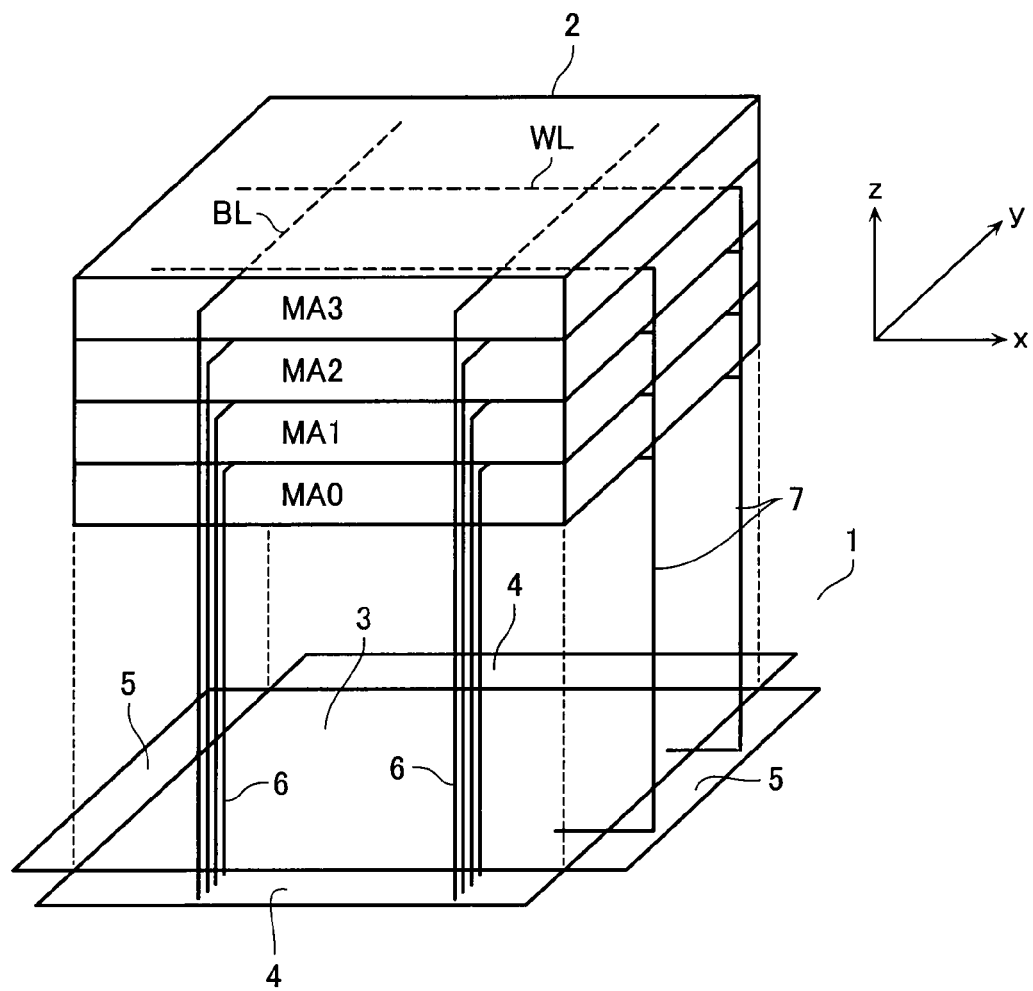
FIG. 1 is a perspective view illustrating a configuration of a resistive memory device according to a first embodiment.

FIG. 1 illustrates a basic configuration of a resistive memory device according to an embodiment of the present invention, i.e., configuration of a wiring region 3, in which wirings such as global buses are formed on a semiconductor substrate 1, and a memory block 2 laminated thereon.

In the case of FIG. 1, the memory block 2 includes four layers of memory cell arrays MA0 to MA3. The wiring region 3 is provided on the semiconductor substrate 1 immediately below the memory block 2. The wiring region 3 has, for example, global buses provided thereon for communicating data written to and read from the memory block 2 with the external. As described below, a column control circuit including a column switch, etc., and a row control circuit including a row decoder, etc., may also be provided on the wiring region 3.

It is necessary to provide vertical wirings (via contacts) on the side surface of the memory block 2 for connecting word lines WL and bit lines BL of the laminated memory cell arrays MA to the wiring region 3 formed on the semiconductor substrate 1. The wiring region 3 has bit-line contact regions 4 and word-line contact regions 5 provided on its four sides. The bit-line contact regions 4 and the word-line contact regions 5 have bit-line contacts 6 and word-line contacts 7 formed therein for connecting the bit lines BL and the word lines WL to the control circuits. Each of the word lines WL is connected to the wiring region 3 via a respective word-line contact 7, one end of which is formed on one of the word-line contact regions 5. In addition, each of the bit lines BL is connected to the wiring region 3 via a respective bit-line contact 6, one end of which is formed on one of the bit-line contact regions 4.

Although FIG. 1 illustrates one memory block 2 with multiple memory cell arrays MA laminated therein in a direction perpendicular to the semiconductor substrate 1 (the z direction of FIG. 1), a plurality of such memory blocks 2 are, in fact, arranged in a matrix form in a longitudinal direction to the word lines WL (the x direction of FIG. 1) as well as in another longitudinal direction to the bit lines BL (the y direction of FIG. 1).

As illustrated in FIG. 1, in the one word-line contact region 5 according to this embodiment, only one line of contacts, i.e., those word lines WL in all layers of one cross section are connected to the wiring region 3 via respective common contacts. In addition, in the one bit-line contact region 4, the bit lines BL in each layer are connected to the wiring region 3 via four lines of contacts separately prepared for each layer. Although the bit lines BL are independently driven for each layer and the word lines WL are connected in common in all layers in this embodiment, the word lines WL may also be independently driven for each layer. Alternatively, the bit lines BL may also be connected in common and the word lines WL may be independently driven. Moreover, at least one of the bit lines BL and the word lines WL may be configured to be shared between the upper and lower layers.

Figure 2:
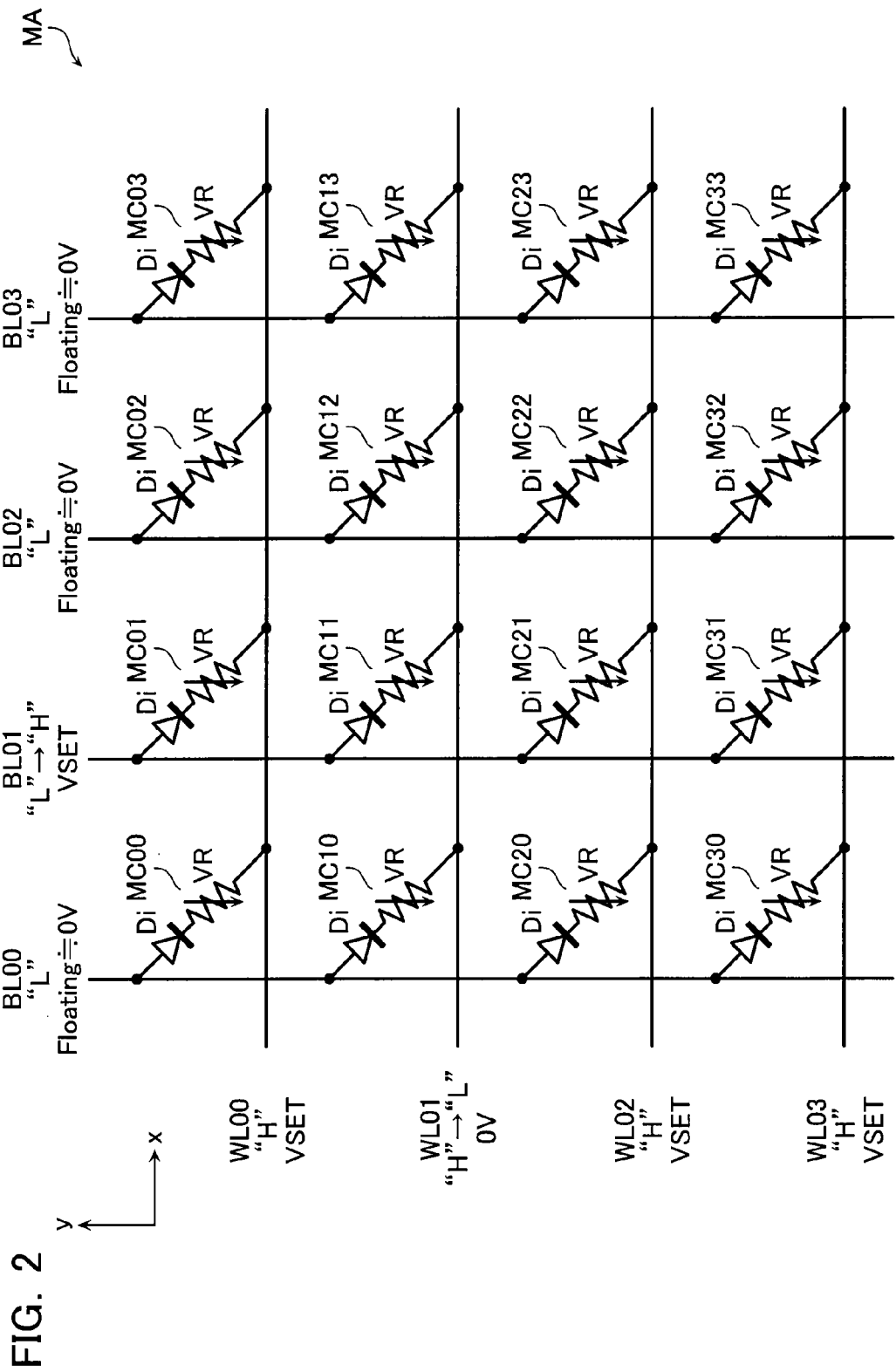
FIG. 2 is an equivalent circuit diagram of a memory cell array in the resistive memory device according to the first embodiment.

FIG. 2 is an equivalent circuit diagram of a memory cell array MA in the resistive memory device. In this case, the memory cell array MA illustrated in FIG. 2 has, for example, 2K-bit (2048) unit memory cells MC arranged in a longitudinal direction of the bit lines BL (the y direction of FIG. 2) as well as 512-bit unit memory cells MC arranged in a longitudinal direction of the word lines WL (the x direction of FIG. 2), respectively. Therefore, 1M-bit (about $10^6$) unit memory cells are arranged in each of the memory cell array MA. In the memory cell array MA, the unit memory cell are arranged in a two dimensional matrix form. As can be seen, resistance-varying type unit memory cells MC are positioned at intersections between word lines WL and bit lines BL, with rectifier elements, e.g., diodes Di, and variable resistance elements VR connected in series. It should be noted that the arrangement and polarity of the diodes Di and the variable resistance elements VR included in the memory cells MC are not limited to the illustrated ones.

The variable resistance elements VR, which have, for example, a structure of electrode/transition metal oxide/electrode, provide a change in resistance value of metal oxide depending on the conditions of applied voltage, current, heat, etc., and store the different states of the resistance values as information in a non-volatile manner. More specifically, the following can be used as the variable resistance elements VR: changing resistance values with a phase transition between a crystalline state and an amorphous state, such as chalcogenide (PCRAM); changing resistance values by depositing metal cations to form a contacting bridge between electrodes, or ionizing the deposited metal to break down the contacting bridge (CBRAM: Conductive Bridging RAM); changing resistance values through application of voltage or current (ReRAM) (which is divided broadly into two types: one is the type where a resistance change occurs depending on the absence of presence of charges trapped by a charge trapping residing on the electrode interface; and the other is the type where a resistance change occurs depending on the absence or presence of a conductive path due to oxygen defect, etc.); and so on.

For unipolar-type ReRAM, data is written to a memory cell MC by applying, for on the order of 10 ns to 100 ns, a voltage of, e.g., 3.5V (in fact, on the order of 4.5V if a voltage drop in the corresponding diode Di is included) and a current of on the order of 10 nA to a variable resistance element VR. As a result, the variable resistance element VR changes from a high resistance state to a low resistance state. The operation of changing the variable resistance element VR from the high resistance state to the low resistance state is hereinafter referred to as the "set operation".

The variable resistance element VR in its low resistance state after the set operation is applied, for on the order of 500 ns to 2 μs, a voltage of 0.8V (in fact, on the order of 1.8V if a voltage drop in the corresponding diode Di is included) and a current of on the order of 1 μA to 10 μA to. As a result, the variable resistance element VR changes from the low resistance state to the high resistance state. The operation of changing the variable resistance element VR from the low resistance state to the high resistance state is hereinafter referred to as the "reset operation".

For example, memory cell MC takes the high resistance state as a stable state (reset state) and data is written to each memory cell MC by such a set operation that causes a reset state to be switched to the low resistance state for binary storage.

A read operation from the memory cell MC is performed by applying a voltage of 0.4V (in fact, on the order of 1.4V if a voltage drop in the corresponding diode Di is included) to the variable resistance element VR and monitoring a current flowing through the variable resistance element VR. As a result, it is determined whether the variable resistance element VR is in its low resistance or high resistance state.

FIG. 2 illustrates the states of voltage applied to the bit lines BL and the word lines WL connected to a memory cell array MA in a set operation of the memory cell MC. In this case, given that a selected memory cell MC to which data is to be written by the set operation is MC11.

Nonselected bit lines BL00, BL02 and BL03 which are not connected to the selected memory cell MC11 are in an "L" state (in the first embodiment, a floating state ≈0 V). In the set operation, a selected bit line BL01 connected to the selected memory cell MC11 is driven from the "L" state (the floating state ≈0 V) into an "H" state (in the first embodiment, a voltage VSET). The nonselected word lines WL00, WL02 and WL03 which are not connected to the selected memory cell MC11 are in the "H" state (in the first embodiment, the voltage VSET). In the set operation, the selected word line WL01 connected to the selected memory cell MC11 is driven from the "H" state (the voltage VSET) into the "L" state (in the first embodiment, the voltage Vss=0 V). As a result, a diode Di of the selected memory cell MC11 is turned to a forward bias state, which causes current to flow therethrough. As a result, the variable resistance element VR of the selected memory cell MC11 is changed from a high resistant state into a low resistant state, so that the set operation is completed.

In the first embodiment, a voltage is not applied to the nonselected bit lines BL connected to the nonselected memory cells MC at the time of the set operation, and thus the nonselected bit lines BL are still in a floating state. The column control circuit which controls the bit lines BL applies a set voltage (in the first embodiment, the voltage VSET) to specific bit line BL (in the first embodiment, the bit line BL01) at the time of the set operation. However, the column control circuit does not have to control the other nonselected bit lines BL (bit lines BL00 BL02 and BL03) at the time of the set operation. For this reason, a configuration which drives the nonselected bit lines BL (bit lines BL00, BL02 and BL03) into a nonselected state (for example, Vss=0 V) can be omitted. That is, the set operation of the memory cell array MA can be executed by the column control circuit having simpler configuration.

Second Embodiment

Figure 3:
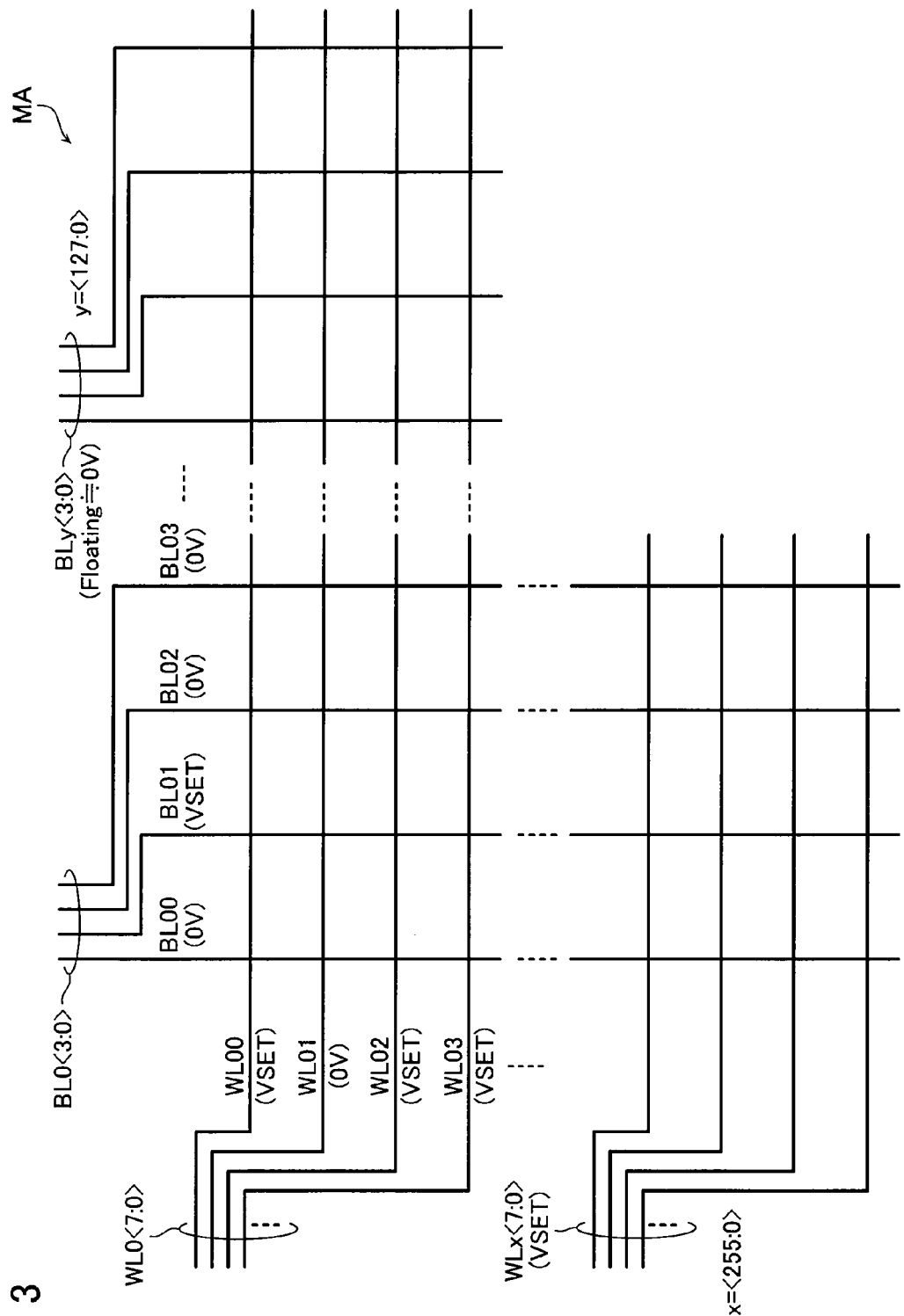
FIG. 3 is a diagram illustrating wirings of the memory cell arrays of the resistive memory device according to a second embodiment.
Figure 4:
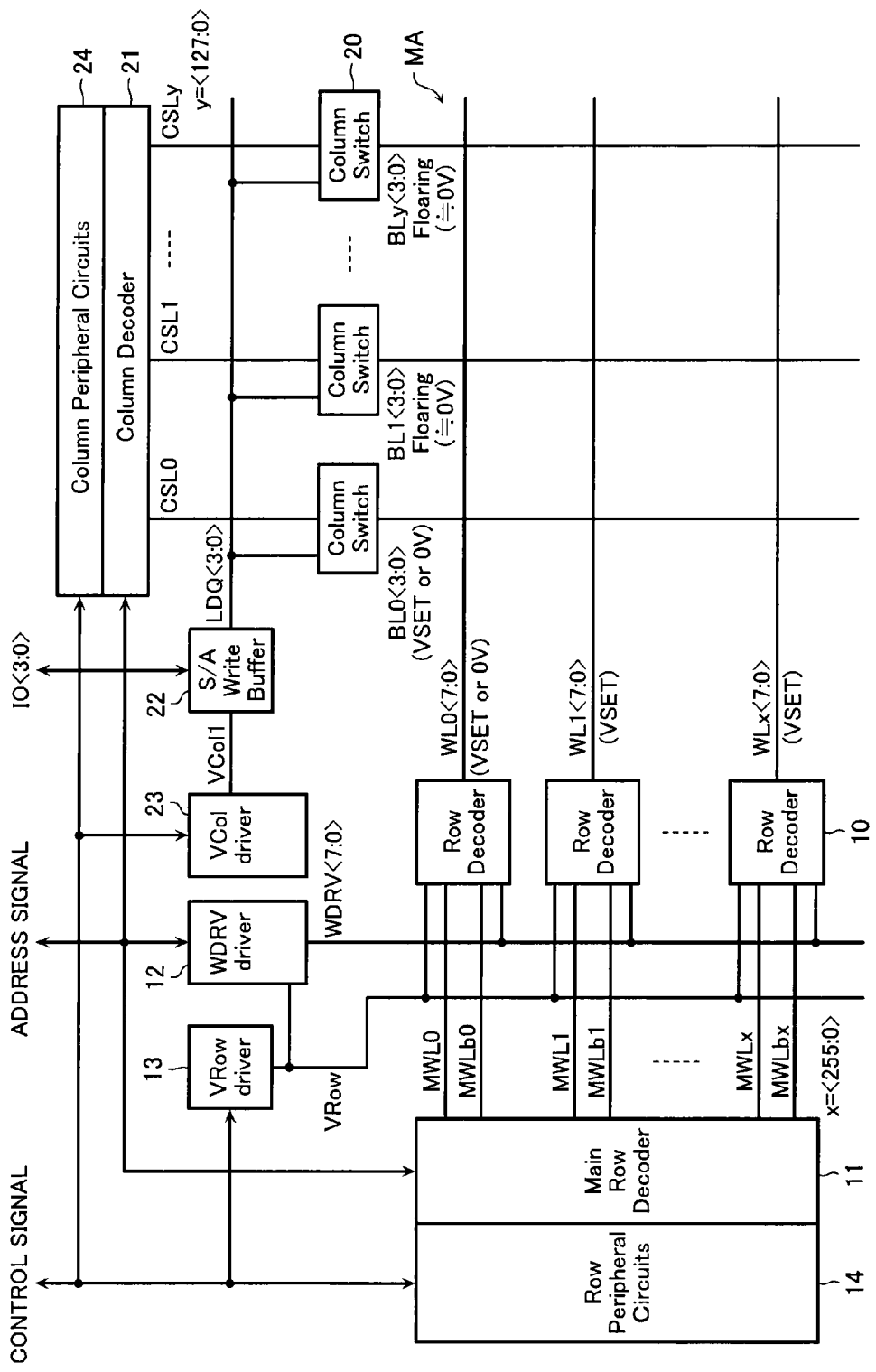
FIG. 4 is a block diagram illustrating an arrangement example of column/row control circuits of the resistive memory device according to the second embodiment.

The resistive memory device according to a second embodiment of the present invention is described below with reference to FIGS. 3 to 12. FIG. 3 is a diagram illustrating wirings of the memory cell array MA of the resistive memory device. FIG. 4 is a block diagram illustrating an arrangement example of a column/row control circuit of the resistive memory device. FIGS. 5 to 12 are circuit diagrams illustrating example configurations of the column/row control circuits of the resistive memory device. A basic configuration of the resistive memory device according to the second embodiment is similar to that of the resistive memory device according to the first embodiment. In the resistive memory device according to the second embodiment, portions having the same configurations as those in the first embodiment are denoted by the same reference symbols, and the description thereof is omitted.

As shown in FIG. 3, the bit lines BL and the word lines WL according to the second embodiment have a hierarchical structure. Any one of bit line groups BLy<3:0> comprises four wirings including the bit lines BLy0 to bit lines BLy3. Any one of word line groups WLx<7:0> comprises eight wirings including word lines WLx0 to WLx7. In a wiring diagram of the memory cell array MA in FIG. 3, the description of the memory cells MC which are arranged on intersection portions between the bit lines BL and the word lines WL, respectively, are omitted. The unit memory cells MC are actually arranged on the respective intersection portions similarly to the first embodiment. Further, the bit line BL and the word line WL selected at the time of set operation are the bit line BL01 and the word line WL01, similarly to the first embodiment.

In the set operation of the resistive memory device, a certain bit line group BLy<3:0> is selected by a column decoder which is described later. In the second embodiment, it is assumed that a bit line group BL0<3:0> is selected. In the selected bit line group BL0<3:0>, the nonselected bit lines BL00, BL02 and BL03 which are not connected to the selected memory cell MC are in the "L" state (in the second embodiment, 0 V). At the time of the set operation, the selected bit line BL01 connected to the selected memory cell MC in the selected bit line group BL0<3:0> is driven from the "L" state (0 V) into the "H" state (in the second embodiment, the voltage VSET). All the bit lines BLy0 to BLy3 included in the other nonselected bit line groups BLy<3:0> are in the floating state (≈0 V).

At the time of the set operation of the resistive memory device, a word line group WLx<7:0> is selected by a main row decoder which is described later. In the second embodiment, it is assumed that a word line group WL0<7:0> is selected. In the selected word line group WL0<7:0>, the nonselected word lines WL00, WL02 and WL03 which are not connected to the selected memory cell MC are in the "H" state (in the second embodiment, the voltage VSET). At the time of the set operation, the selected word line WL01 connected to the selected memory cell MC in the selected word line group WL0<7:0> is driven from the "H" state (voltage VSET) into the "L" state (in the second embodiment, the voltage Vss=0 V). All the word lines WLx0 to WLx7 included in the other nonselected word line group WLx<7:0> are in the "H" state (in the second embodiment, the voltage VSET).

As a result, the diode Di of the selected memory cell MC connected to the selected bit line BL01 and the selected word line WL01 is turned to the forward bias state, which causes current to flow therethrough. As a result, the variable resistance element VR of the selected memory cell MC is changed from the high resistant state into the low resistant state, so that the set operation is completed.

In the second embodiment, in the bit lines BL having the hierarchical structure, a voltage is not applied to the bit line group BLy<3:0> which does not include the selected bit line BL01 connected to the selected memory cell MC at the time of the set operation. That is, the bit line group BLy<3:0> is in the floating state. The column control circuit which controls the bit lines BL applies a set voltage (voltage VSET) to the selected bit line BL (bit line BL01) at the time of the set operation. The column control circuit applies a voltage Vss to the nonselected bit lines BL (BL00, BL02 and BL03). The column control circuit does not have to control the bit line group BLy<3:0> which is not selected at the time of the set operation. For this reason, the set operation can be performed on the memory cell array MA by the column control circuit having the simpler configuration where the configuration which drives the bit line group BLy<3:0> into a nonselected state (for example, Vss=0 V) is omitted.

[Configuration of Control Circuit]

A configuration of a column control circuit and a row control circuit which applied the above described voltage to the bit line BL and the word line WL will be described. In this embodiment, the case in which 1M-bit (about $10^6$) unit memory cells MC are arranged in the one memory cell array MA will be described by way of example. In the memory cell array MA, 2K-bit (2048) unit memory cells MC are arranged in the longitudinal direction of the bit line BL, and 512-bit unit memory cells MC are arranged in the longitudinal direction of the word line WL. FIG. 4 is a block diagram illustrating an example of the arrangement of the column control circuit and the row control circuit in the resistive memory device.

Referring to FIG. 4, the row control circuit includes a row decoder 10, a main row decoder 11, a write drive line driver 12, a row power supply line driver 13, and a row-system peripheral circuit 14. The column control circuit includes a column switch 20, a column decoder 21, a sense amplifier/write buffer 22, a column power supply line driver 23, and a column-system peripheral circuit 24.

The word line WL of the embodiment has a hierarchical structure, and the main row decoder 11 selectively drives one of 256 pairs of main word lines MWLx and MWLbx (x=<255:0>). For example, in the selected main word lines MWLx and MWLbx, the main word line MWLx becomes the "H" state and the main word line MWLbx becomes the "L" state. On the contrary, in the non-selected main word lines MWLx and MWLbx, the main word line MWLx becomes the "L" state and the main word line MWLbx becomes the "H" state. One pair of main word lines MWLx and MWLbx is connected to one row decoder 10.

The row decoder 10 selectively drives one of eight word lines WL included in the word line group WLx<7:0>. The word line group WLx<7:0> is located under the hierarchy of the main word lines MWLx and MWLbx. The row decoder 10 connected to the main word lines MWLx and MWLbx selectively driven by the main row decoder 11 further selectively drives the word line WL, thereby selectively driving one word line WL. Eight write drive lines WDRV<7:0> and row power supply line VRow are connected to the write drive line driver 12, and the row power supply line VRow is connected to the row power supply line driver 13. The voltage (VSET) is applied to the row power supply line VRow. The voltage (VSET) is supplied to the word line WL under the hierarchy of the non-selected main word line MWL and MWLbx, and the non-selected word line WL under the hierarchy of the selected main word line MWL and MWLbx The write drive lines WDRV<7:0> and the row power supply line VRow are connected to the row decoder 10. The voltage is applied to the write drive line WDRV<7:0> and the row power supply line VRow in order that the row decoder 10 drives the word line WL. Specifically, during the set operation, the voltage Vss (=0 V) is supplied to one write drive line WDRV corresponding to the selected word line WL in the eight write drive lines WDRV<7:0>, and the voltage VSET is supplied to other write drive lines WDRV of the write drive lines WDRV<7:0>. The row-system peripheral circuit 14 manages the whole of the resistive memory device. The row-system peripheral circuit 14 receives a control signal from an external host device, the row-system peripheral circuit 14 reads, write, and erases the data, and the row-system peripheral circuit 14 performs data input and output management.

The bit line BL of the embodiment also has the hierarchical structure, and the column decoder 21 selectively drives one of column selection lines CSLy (y=<255:0>) in 128 lines. For example, the selected column selection lines CSLy becomes the "H" state. On the contrary, the non-selected column selection lines CSLy becomes the "L" state. One of column selection line CSLy is connected to one column switch 20.

The column switch 20 selectively drives one of four bit lines BL included in the bit line group BLy<3:0>. The bit line group BLy<3:0> is located under the hierarchy of the column selection line CSLy. The column switch 20 connected to the column selection line CSLy selectively driven by the column decoder 21 further selectively drives the bit line BL, thereby selectively driving the bit line BL. The sense amplifier/write buffer 22 detects and amplifies signals read on the local data lines LDQ<3:0>, and the sense amplifier/write buffer 22 supplies the write data fed from data input and output lines IO<3:0> to the memory cell MC through the column switch 20. The column power supply line driver 23 is connected to the column power supply line VCol1.

The local data lines LDQ<3:0> are connected to the column switch 20. The voltage is applied to the local data line LDQ<3:0> in order that the column switch 20 drives the bit line BL. Specifically, voltage VSET is supplied to one of four local data lines LDQ<3:0> corresponding to the selected bit line BL in the set operation, and voltage Vss=0V is supplied to remaining local data lines LDQ<3:0>. In addition, in the set operation, the column switch 20 which is not selected by the column selection line CSLy is not execute a bit line drive operation. Thus, the bit line groups BLy<3:0> are in the floating state. The column-system peripheral circuit 24 manages the whole of the resistive memory device. The column-system peripheral circuit 24 receives a control signal from an external host apparatus, the column-system peripheral circuit 24 reads, write, and erases the data, and the column-system peripheral circuit 24 performs data input and output management.

The detailed configuration of the row control circuit will be described with reference to FIGS. 5 to 8. FIGS. 5 to 10 are circuit diagrams illustrating an example of the configuration of the row control circuit in the resistive memory device.

[Configuration of Row Decoder 10]

Figure 5:
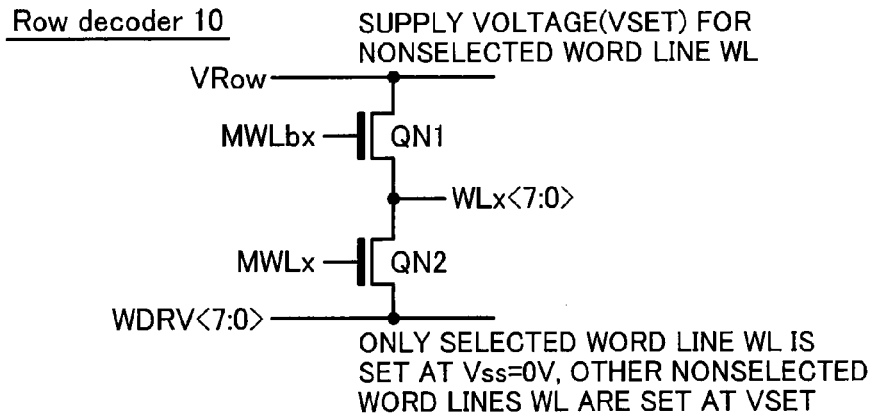
FIG. 5 is a circuit diagram illustrating an example configuration of the row control circuit of the resistive memory device according to the second embodiment.

As illustrated in FIGS. 4 and 5, one of the 256 pairs of main word lines MWLx and MWLbx (x=<255:0>), the row power supply line VRow, and the write drive lines WDRV<7:0> are connected to the row decoder 10. The word line group WLx<7:0> is connected to the row decoder 10, and the word line group WLx<7:0> is connected to the plural memory cells MC that are arrayed in line. As described above, the word line group WLx<7:0> connected to the one row decoder 10 includes the eight wirings of word line WLx0 to word line WLx7. Similarly the write drive lines WDRV<7:0> are the eight wirings WDRV0 to WDRV7.

As illustrated in FIG. 5, the row decoder 10 includes eight transistor pairs each of which sources of two NMOS transistors QN1 and QN2 are connected to each other. The main word line MWLbx is connected to a gate of the transistor QN1 and the row power supply line VRow is connected to a drain of the transistor QN1. The main word line MWLx is connected to the gate of the transistor QN2 and one of the write drive lines WDRV<7:0> is connected to the drain of the transistor QN2. The sources of the transistors QN1 and QN2 are connected to one of the word lines WL included in the word line group WLx<7:0>

[Configuration of Main Row Decoder 11]

Figure 6:
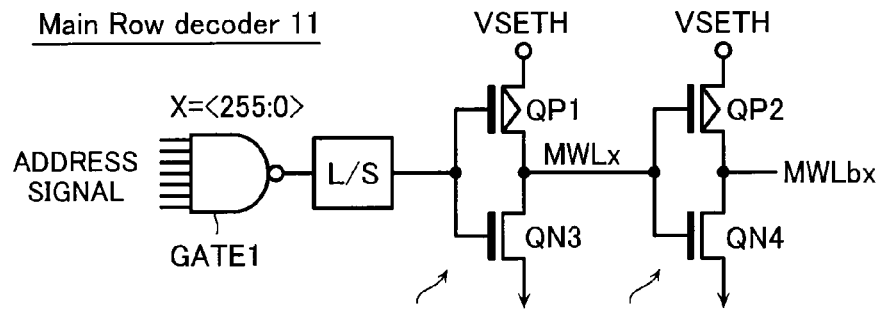
FIG. 6 is a circuit diagram illustrating an example configuration of the row control circuit of the resistive memory device according to the second embodiment.

As illustrated in FIGS. 4 and 6, 256 pairs of main word lines MWLx and MWLbx (x=<255:0>) and an address signal line are connected to the main row decoder 11. The word line WL of the resistive memory device of the embodiment has the hierarchical structure. The main row decoder 11 is a pre-decoder. One set of main word lines MWLx and MWLbx is connected to eight transistor pairs (QN1 and QN2 of FIG. 5) in one row decoder 10, and one row decoder 10 can select one of the eight word lines WLx<7:0>. The main row decoder 11 includes a circuit of FIG. 6 in each set of main word lines MWLx and MWLbx.

As illustrated in FIG. 6, in one main row decoder 11, the address signal line connected to the main row decoder 11 is connected to a logic gate GATE1. An output signal of the logic gate GATE1 is supplied to an input terminal of a CMOS inverter CMOS1 through a level shifter L/S. The CMOS inverter CMOS1 includes a PMOS transistor QP1 and an NMOS transistor QN3. A power supply VSETH is connected to the source of the transistor QP1, and the source of the transistor QN3 is grounded. The drains of the transistors QP1 and QN3 are connected to the main word line MWLx.

The main word line MWLx is connected to a CMOS inverter CMOS2. The CMOS inverter CMOS2 includes a PMOS transistor QP2 and an NMOS transistor QN4. The power supply VSETH is also connected to the source of the transistor QP2 and the source of the transistor QN4 is grounded. The drains of the transistors QP2 and QN4 are connected to the main word line MWLbx.

[Configuration of Write Drive Line Driver 12]

Figure 7:
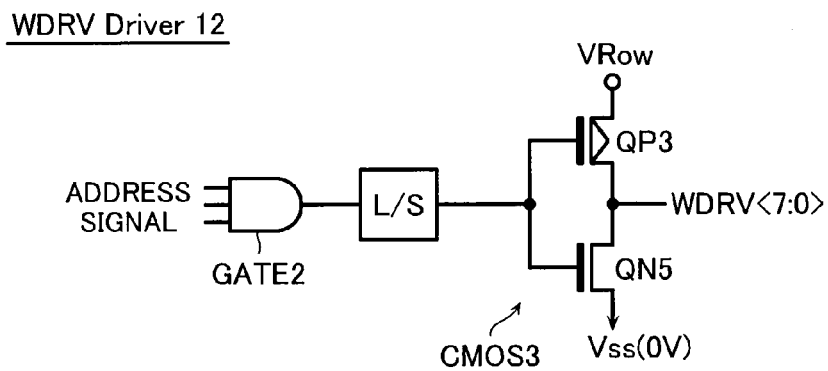
FIG. 7 is a circuit diagram illustrating an example configuration of the row control circuit of the resistive memory device according to the second embodiment.

As illustrated in FIGS. 4 and 7, the row power supply line VRow and the address signal line are connected to the write drive line driver 12. At this point, the write drive line driver 12 is also a pre-decoder.

The address signal line connected to the write drive line driver 12 is connected to a logic gate GATE2. An output signal of the logic gate GATE2 is supplied to an input terminal of a CMOS inverter CMOS3 through a level shifter L/S. The CMOS inverter CMOS3 includes a PMOS transistor QP3 and an NMOS transistor QN5. The row power supply line VRow to which the voltage VSET is applied as described later is connected to the source of the transistor QP3, and the source of the transistor QN5 is grounded. The drains of the transistors QP3 and QN5 are connected to the write drive lines WDRV<7:0>.

[Configuration of Row Power Supply Line Driver 13]

Figure 8:
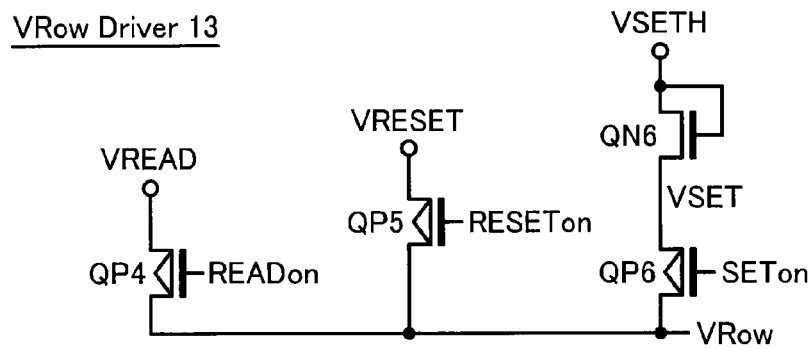
FIG. 8 is a circuit diagram illustrating an example configuration of the row control circuit of the resistive memory device according to the second embodiment.

As illustrated in FIGS. 4 and 8, the row power supply line VRow and a control signal line are connected to the row power supply line driver 13. In the row power supply line driver 13, the power supply VREAD is connected to the row power supply line VRow through a PMOS transistor QP4, and the power supply VRESET is connected to the row power supply line VRow through a PMOS transistor QP5. A control signal READon is supplied to the gate of the transistor QP4, and a control signal RESETon is supplied to the gate of the transistor QP5. The control signals READon and RESETon are changed from the "H" state to the "L" state in reading the data and in the reset operation, respectively.

In addition, the power supply VSETH is connected to the row power supply line driver 13. The power supply VSETH is connected to the drain and gate of the NMOS transistor QN6. The source of the transistor QN6 is connected to the row power supply line VRow through a PMOS transistor QP6. A control signal SETon is supplied to the gate of the transistor QP6.

A detailed configuration of the column control circuit will be described with reference to FIGS. 9 to 12. FIGS. 9 to 12 are circuit diagrams illustrating an example of the configuration of the column control circuit in the resistive memory device.

[Configuration of Column Switch 20]

Figure 9:
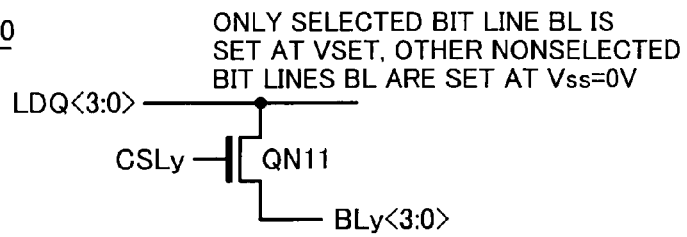
FIG. 9 is a circuit diagram illustrating an example configuration of the column control circuit of the resistive memory device according to the second embodiment.

As illustrated in FIGS. 4 and 9, one of the 128 lines of column selection lines CSLy (y=<127:0>) and the local data lines LDQ<3:0> are connected to the column switch 20. In addition, the bit line group BLy<3:0> is connected to the column switch 20, and the bit line group BLy<3:0> is connected to the plural memory cells MC that are arranged in line. As described above, the bit line group BLy<3:0> connected to one column switch 20 includes the four wirings, the bit lines BLy0 to BLy3. Similarly, the local data lines LDQ<3:0> includes the four wirings, local data lines LDQ0 to LDQ3.

As illustrated in FIG. 9, the column switch 20 has NMOS transistor QN11. One of the column switch includes four NMOS transistors QN11. The column selection line CSLy is connected to the gate of the transistor QN11, and one of the local data lines LDQ<3:0> is connected to the drain of the transistor QN11. The sources of the transistors QN11 are connected to one of the bit lines BL included in the bit line group BLy<3:0>.

[Configuration of Column Decoder 21]

Figure 10:
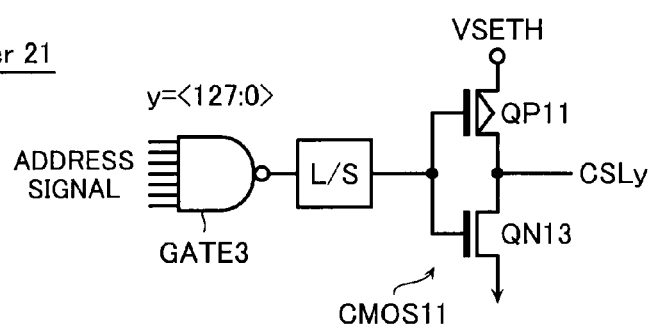
FIG. 10 is a circuit diagram illustrating an example configuration of the column control circuit of the resistive memory device according to the second embodiment.

As illustrated in FIGS. 4 and 10, the 128 lines of column selection lines CSLy (y=<127:0>) and the address signal line are connected to the column decoder 21. In the resistive memory device of the embodiment, one of column selection lines CSLy is connected to four transistors (QN11 of FIG. 9) in one column switch 20, and one column switch 20 selectively drives one of the bit line in the bit line group BLy<3:0>.

The column decoder 21 includes a circuit of FIG. 10 in each of column selection lines CSLy.

As illustrated in FIG. 10, in one column decoder 21, the address signal line connected to the column decoder 21 is connected to a logic gate GATE3. An output signal of the logic gate GATE3 is supplied to an input terminal of a CMOS inverter CMOS11 through a level shifter L/S. The CMOS inverter CMOS11 includes a PMOS transistor QP11 and an NMOS transistor QN13. The power supply VSETH is connected to the source of the transistor QP11 and the source of the transistor QN13 is grounded. The drains of the transistors QP11 and QN13 are connected to the column selection line CSLy.

[Configuration of Sense Amplifier/Write Buffer 22]

Figure 11:
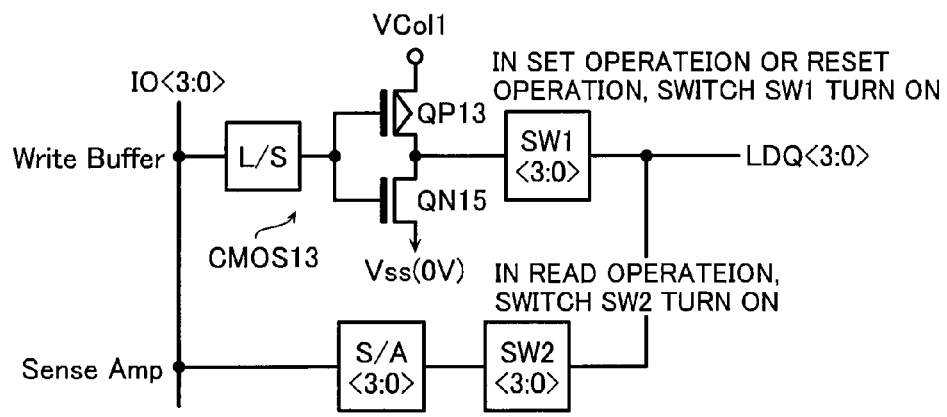
FIG. 11 is a circuit diagram illustrating an example configuration of the column control circuit of the resistive memory device according to the second embodiment.

As illustrated in FIGS. 4 and 11, the column power supply line VCol1, the local data lines LDQ<3:0>, and the data input and output lines IO<3:0> are connected to the sense amplifier/write buffer 22. A configuration of the write buffer portion will be described below. The data input and output lines IO<3:0> connected to the sense amplifier/write buffer 22 are connected to a CMOS inverter CMOS13 through a level shifter L/S. The CMOS inverter CMOS13 includes a PMOS transistor QP13 and an NMOS transistor QN15. The column power supply line VCol1 is connected to the source of the transistor QP13. The set voltage VSET is applied to the column power supply line VCol1 as described later. The source of the transistor QN15 is grounded. The drains of the transistors QP13 and QN15 are connected to the local data lines LDQ<3:0> through a switch SW1.

Then a sense amplifier portion will be described below. The data input and output lines IO<3:0> connected to the sense amplifier/write buffer 22 are connected to a sense amplifier S/A. A various type of sense amplifier may be used as the sense amplifier S/A, such as single end type, differential type using a reference cell, and so on. An output terminal of the sense amplifier S/A is connected to the local data lines LDQ<3:0> through a switch SW2.

[Configuration of Column Power Supply Line Driver 23]

Figure 12:
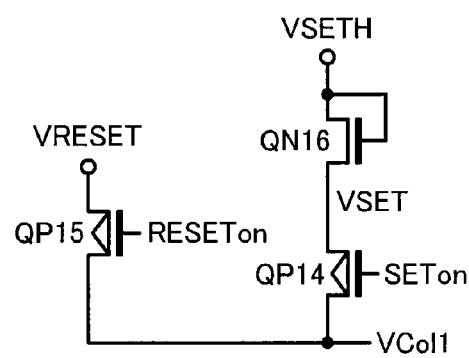
FIG. 12 is a circuit diagram illustrating an example configuration of the column control circuit of the resistive memory device according to the second embodiment.

As illustrated in FIGS. 4 and 12, the column power supply line VCol1 and the control signal line are connected to the column power supply line driver 23. In the column power supply line driver 23, the power supply VRESET is connected to the column power supply line VCol1 through a PMOS transistor QP15.

The control signal RESETon is supplied to the gate of the transistor QP15. In addition, the power supply VSETH is connected to a drain and a gate of an NMOS transistor QN16, and a source of the transistor QN16 is connected to the column power supply line VCol1 through a PMOS transistor QP14. The control signal SETon is supplied to the gate of the transistor QP14.

Set operations in the resistive memory device so configured will now be described below. Referring first to FIGS. 4 to 8, the operation of the row control circuit in the resistive memory device in set operation will be described below. As illustrated in FIG. 4, the word lines WL have a hierarchical structure. The voltage, which is applied to the write drive lines WDRV<7:0> or the row power supply line VRow, is applied to the word lines group WLx<7:0> selectively driven by the main row decoder 11 and the row decoder 10. Firstly, the operation for applying voltage to the write drive lines WDRV<7:0> and the row power supply line VRow that are connected to the row decoder 10 will be described below.

[Operation of Row Power Supply Line Driver 13]

In set operation, at the row power supply line driver 13, the control signal (SETon signal) that has been supplied to the gate of the transistor QP6 becomes "L" state and the transistor QP6 is conducting. The voltage VSETH of the power supply VSETH transferred by the NMOS transistor QN6 becomes a voltage VSET. The row power supply line driver 13 drives the row power supply line VRow to the voltage VSET in set operation.

[Operation of Write Drive Line Driver 12]

A write drive line driver 12 has a logic gate GATE2 to which an address signal is input. Based on the address signal, the logic gate GATE2 supplies to the input terminal of the CMOS inverter CMOS3 an "H" signal for one of the write drive lines (e.g., WDRV1) that corresponds to the address signal, and an "L" signal for every other write drive line that does not correspond to the address signal. For a write drive line (e.g., WDRV1) that corresponds to the address signal, an "H" signal is supplied to the input terminal of the CMOS inverter CMOS3, and a ground voltage Vss (e.g., 0V) is applied to the write drive line WDRV1 via the conducting transistor QN5. For every other write drive line that does not correspond to the address signal, an "L" signal is supplied to the input terminal of the CMOS inverter CMOS3, and the voltage of the row power supply line VRow (VSET) is applied to the write drive lines WDRV via the conducting transistor QP3.

Secondly, how the main word lines MWLx, MWLbx and the word lines WLx<7:0> are selectively driven by the main row decoder 11 and the row decoder 10 will be described below.

[Operation of Main Row Decoder 11]

An address signal is also supplied to the input terminal of a logic gate GATE1 in the main row decoder 11. Based on the address signal, the logic gate GATE1 supplies to the input terminal of a CMOS inverter CMOS1 an "L" signal for the selected x (e.g., x=0) of x=<255:0>, and an "H" signal for every non-selected x.

Firstly, description is made on the selected x (e.g., x=0). For the selected x (e.g., x=0), an "L" signal is supplied to the input terminal of the CMOS inverter CMOS1, and an "H" signal of the power supply VSETH is supplied to a main word line MWL0 via the conducting transistor QP1. In addition, the "H" signal of the main word line MWL0 is supplied to the input terminal of a CMOS inverter CMOS2, and the "L" signal at ground voltage Vss is supplied to a main word line MWLb0 via the conducting transistor QN4. That is, for the selected x (e.g., x=0), an "H" signal is supplied to the main word line MWL0, while an "L" signal is supplied to the main word line MWLb0.

Secondly, description is made on the non-selected x. For each non-selected x, an "H" signal is supplied to the input terminal of a CMOS inverter CMOS1, and an "L" signal at ground voltage Vss is supplied to a main word line MWLx via the conducting transistor QN3. In addition, the "L" signal of the main word line MWLx is supplied to the input terminal of a CMOS inverter CMOS2, and the "H" signal of the power supply VSETH is supplied to a main word line MWLbx via the conducting transistor QP2. That is, for each non-selected x, an "L" signal is supplied to a respective main word line MWLx, while an "H" signal is supplied to a respective main word line MWLbx.

[Operation of Row Decoder 10]

The row decoder 10 applies the voltage of the row power supply line VRow or the write drive lines WDRV to the corresponding word lines WL based on the signals supplied to the main word lines MWLx and MWLbx. For the selected x (e.g., x=0), an "H" signal is supplied to the main word line MWL0 and an "L" signal is supplied to the main word line MWLb0. Since an "L" signal is supplied to the gate of the transistor QN1 and an "H" signal is supplied to the gate of the transistor QN2 in the row decoder 10, the voltage of the write drive lines WDRV<7:0> is applied to the word lines group WL0<7:0> via the conducting transistor QN2. In this case, a ground voltage (e.g., 0V) is applied to a write drive line (e.g., WDRV1) that corresponds to the address signal, and the voltage of the row power supply line VRow (e.g., VSET) is applied to the other write drive lines that do not correspond to the address signal. The ground voltage (e.g., 0V) is only applied to one of the word lines WL01 among the word line group WL0<7:0> that corresponds to the address signal, while the voltage VSET is applied to the other word lines WL.

In addition, for each non-selected x, an "L" signal is supplied to a main word line MWLx and an "H" signal is supplied to a main word line MWLbx. Since an "H" signal is supplied to the gate of the transistor QN1 and an "L" signal is supplied to the gate of the transistor QN2 in the row decoder 10, the voltage of the row power supply line VRow (VSET) is applied to the word line group WLx<7:0> via the conducting transistor QN1. As a result, in set operation, the ground voltage (0V) is only applied to one of the word lines WL01 that is selected by the address signal, while the voltage of the row power supply line VRow (VSET) is applied to every other word line WL.

Referring now to FIG. 4 and FIGS. 9 to 12, the operation of the column control circuit in the resistive memory device in set operation will be described below. The voltage, which is applied to local data lines LDQ<3:0>, is applied to the bit line group BLy<3:0> selectively driven by the column decoder 21 and the column switch 20. Firstly, the operation for applying the voltage to the local data lines LDQ<3:0> and the column power supply line VCol1 will be described below.

[Operation of Column Power Supply Line Driver 23]

In set operation, at the column power supply line driver 23, a control signal (SETon signal) that has been supplied to the gate of a transistor QP14 becomes "L" state and the transistor QP14 is conducting. The voltage VSETH of the power supply VSETH transferred by the NMOS transistor QN16 becomes voltage VSET. The column power supply line driver 23 drives the column power supply line VCol1 to a voltage VSET.

[Operation of Sense Amplifier/Write Buffer 22]

In set operation, at the sense amplifier/write buffer 22, switches SW1 of the write buffer part turn on and become conducting, while switches SW2 of the sense amplifier part turn off and become non-conducting. Write data is supplied to the sense amplifier/write buffer 22 from data input/output lines IO<3:0>. The write data is supplied to the input terminal of a CMOS inverter CMOS13 via a level shifter L/S. In response to this data, the local data lines LDQ<3:0> is applied the voltage VSET or the ground voltage (Vss=0V).

Secondly, how column selection lines CSLy and the bit line group BLy<3:0> are selectively driven by the column decoder 21 and the column switch 20 will be described below.

[Operation of Column Decoder 21]

An address signal is supplied to the input terminal of a logic gate GATE3 in the column decoder 21. Based on the address signal, the logic gate GATE3 supplies to the input terminal of the CMOS inverter CMOS11 an "L" signal for each y (e.g., y=0) selected from y=<127:0>, and an "H" signal for each non-selected y. Firstly, description is made on the selected y (e.g., y=0). For each selected y (e.g., y=0), an "L" signal is supplied to the input terminal of the CMOS inverter CMOS11, and an "H" signal of the power supply VSETH is supplied to each of column selection lines CSL0 via the conducting transistor QP11. Secondly, description is made on the non-selected y. For each non-selected y, an "H" signal is supplied to the input terminal of the CMOS inverter CMOS11, and an "L" signal at ground voltage Vss is supplied to the column selection line CSLy via the conducting transistor QN13.

[Operation of Column Switch 20]

The column switch 20 applies the voltage of local data lines LDQ to the bit lines BL based on the signals supplied to the column selection lines CSLy. For the selected y (e.g., y=0), an "H" signal is supplied to the column selection line CSL0. An "H" signal is supplied to the gate of the transistor QN11 in the column switch 20. Thus, the voltage of the local data lines LDQ<3:0> are applied to the bit line group BL0<3:0> via the conducting transistor QN12. The voltage (VSET) of the column power supply line VCol1 is applied to the local data line (e.g., LDQ1) which is corresponding to the address signal and the ground voltage Vss (=0V) is applied to the other local data lines which is not corresponding to the address signal. In the bit line group BL0<3:0>, the voltage (VSET) of the column power supply line VCol1 is applied only to the bit line BL01 which is corresponding to the address signal and the ground voltage Vss (=0V) is applied to the other bit lines BL.

On the other hand, for each non-selected y, an "L" signal is supplied to the column selection line CSLy. An "L" signal is supplied to the gate of the transistor QN11 in the column switch 20. Thus, the transistor QN11 is not conductive and voltage is not applied to the bit line group BLy<3:0>. As a result, the bit line group BLy<3:0> is in the floating state. In set operation, the voltage VSET is applied only to the bit line BL01 selected by the address signal and the ground voltage Vss is applied to the nonselected bit lines BL. Further, every other bit line group BLy<3:0> are in the floating state.

In the column control circuit according to the second embodiment, a voltage (VSET) of the column power source line VCol1 is applied only to one bit line BL01 selected by the address signal at the time of the set operation. Further, a ground voltage Vss is applied to the nonselected bit lines BL00, BL02 and BL03. The other bit line groups BLy<3:0> are in the floating state.

In the second embodiment, in the bit line groups BLy<3:0> having the hierarchical structure, a voltage is not applied to the bit line groups BLy<3:0> which do not include the selected bit line BL01 connected to the selected memory cell MC at the time of the set operation, and thus are held in the floating state. The column control circuit does not have to control the bit line groups BLy<3:0> nonselected at the time of the set operation. For this reason, the set operation can be performed on the memory cell array MA by the column control circuit having a simpler configuration where the constitution which drives the bit line groups BLy<3:0> into the nonselected state (for example, Vss=0 V) is omitted.

Concretely, the configuration of the column switch 20 can include one transistor QN11. In this configuration, the bit line group BL0<3:0> can be driven by the column switch 20 selected by the column selection line CSLy. At the same time, the column switch 20 which is not selected by the column selection line CSLy can maintain the bit line groups BLy<3:0> into the floating state. Unlike the wiring driving circuit described in Japanese Patent Application Laid-Open No. 2008-077697, it is not necessary to apply any one of a driving voltage and a ground voltage to the wirings by means of switching two transistors connected in series. The column switch 20 according to the second embodiment can reduce the number of transistors. In the second embodiment, the memory cells MC of 2 Kbit are arranged in the word line direction and the memory cells MC of 512 bit are arranged in the bit line direction so that the memory cell array MA of 1 Mbit is constituted. The same number of the column switches 20 as the number of the bit lines BL (in the second embodiment, 512) are provided into the column control circuit. For this reason, the column control circuit can be more simplified by reducing the transistors in the column switches 20.

Third Embodiment

Figure 13:
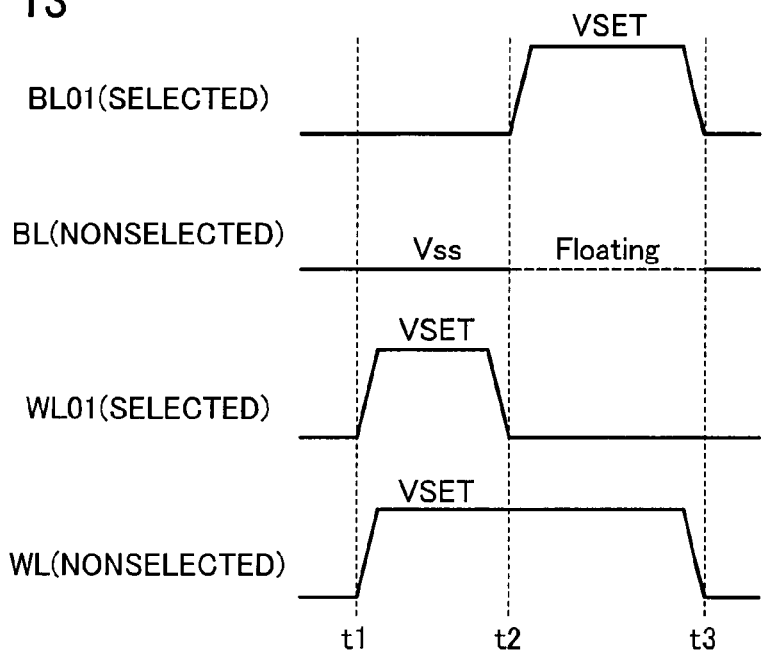
FIG. 13 is a timing chart illustrating operation timing of the column/row control circuits of the resistive memory device according to a third embodiment.

The resistive memory device according to a third embodiment of present invention is described below with reference to FIG. 13. FIG. 13 is a timing chart illustrating the operation timing of the column/row control circuits of the resistive memory device. The configuration of the control circuit in resistive memory device according to the third embodiment is similar to that in the resistive memory device according to the first and second embodiments. In the resistive memory device according to the third embodiment, the portions having the same constitutions as those in the first and second embodiments are denoted by the same symbols, and the description thereof is omitted. The resistive memory device according to the third embodiment is different from the first and second embodiments in that a timing of voltage application to the word lines WL is different from a timing of voltage application to the bit lines BL, when the set operation is performed.

As shown in FIG. 13, when the set operation is performed on the selected memory cells MC, a voltage VSET is applied to all the word lines WL including the selected word line WL01 and the nonselected word lines WL (time t1). While the voltage VSET is applied to all the word lines WL, the selected bit line BL01 and the nonselected bit lines BL are maintained at the ground voltage Vss. Thereafter, the ground voltage Vss is applied only to the selected word line WL01 connected to the selected memory cell MC (time t2). At time t2, after the selected word line WL01 drops to an electric potential Vss, the voltage VSET is applied to the selected bit line BL01, and simultaneously the nonselected bit lines BL are brought into the floating state ($\approx 0$ V).

As a result, the diode Di of the selected memory cell MC connected to the selected bit line BL01 and the selected word line WL01 is turned to the forward bias state, which causes current to flow therethrough. The variable resistance element VR of the selected memory cell MC is changed from the high resistant state into the low resistant state, so that the set operation is completed. On the other hand, since the voltage VSET is applied to both ends of the nonselected memory cells MC connected to the selected bit line BL01 and the nonselected word lines WL, an electric current does not flow therein. Further, since a voltage of 0 V is applied to both ends of the nonselected memory cells MC connected to the nonselected bit lines BL and the selected word line WL01, an electric current does not flow therein. Thereafter, at t3, the selected bit line BL01 and the nonselected word lines WL are dropped to the electric potential Vss so that the set operation is completed.

In order to maintain the selected bit line BL01 and the nonselected bit lines BL at the electric potential Vss from time t1 to time t2 shown in FIG. 13, the write buffer 22 shown in FIG. 11 sets all the local data lines LDQ<3:0> to the ground voltage Vss. At the same time, the column decoder 21 shown in FIG. 10 brings all the column selection lines CS1y into the "H" state. As a result, in all the column switches 20 shown in FIG. 9, the NMOS transistor QN11 is conductive, and the ground voltage Vss of the local data lines LDQ<3:0> is applied to the bit line groups BLy<3:0>. In such a manner, from time t1 to time t2 shown in FIG. 13, both the selected bit line BL01 and the nonselected bit lines BL can be maintained at the electric potential Vss.

At the time of the set operation in the second embodiment, when the nonselected bit lines BL are in the floating state and the voltage VSET is applied to the nonselected word lines WL, the electric potential of the nonselected bit lines BL in the floating state occasionally rises due to coupling. In this case, the set operation might be performed accidentally on the nonselected memory cells MC connected to the nonselected bit lines BL.

However, in the resistive memory device according to the third embodiment, the timing of the voltage application to the word lines WL is shifted from the timing of the voltage application to the bit lines BL. For this reason, while the word lines WL rises to the voltage VSET, the nonselected bit lines BL are maintained at the ground voltage Vss. Thereafter, even when the nonselected bit lines BL are brought into the floating state at the time of the set operation, the electric potential of the nonselected bit lines BL hardly rises from the ground voltage Vss. In the resistive memory device according to the third embodiment, the set operation is not performed accidentally on the nonselected memory cells MC.

Also, in the resistive memory device according to the third embodiment, the column switch 20 can include one transistor QN11. In such a configuration, the column switches 20 selected by the column selection lines CSLy can drive the bit line group BL0<3:0>. At the same time, the column switches 20 which are not selected by the column selection lines CSLy can maintain the bit line groups BLy<3:0> in the floating state. With the column switches 20 according to the third embodiment, the number of transistors can be reduced, and the column control circuit can have simpler configuration.

Fourth Embodiment

Figure 15:
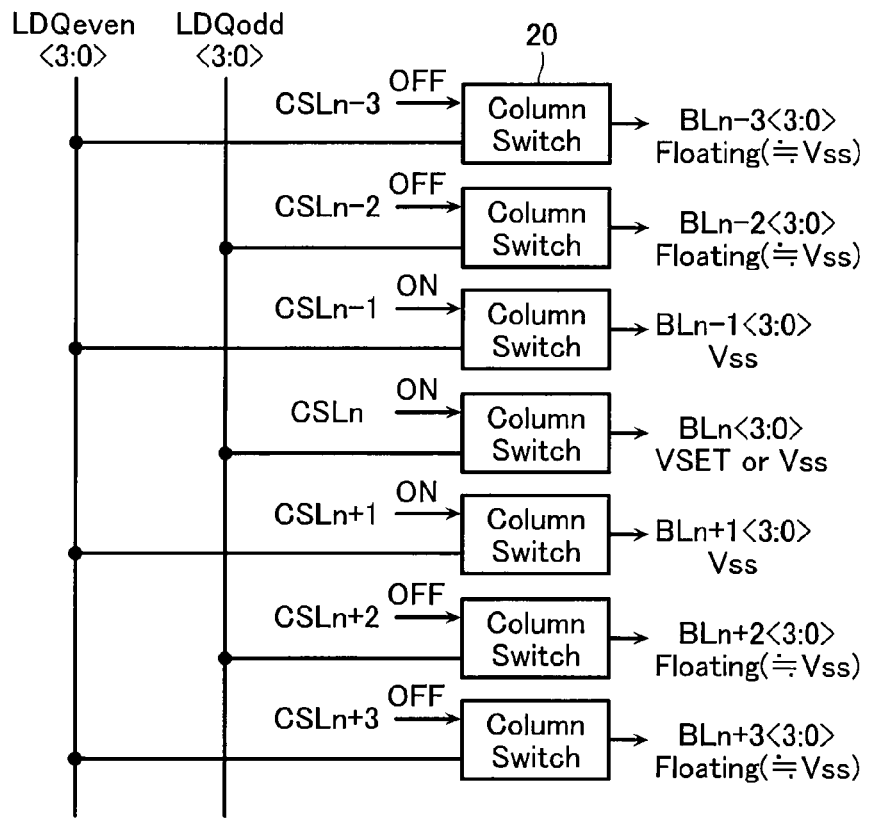
FIG. 15 is a circuit diagram illustrating an example configuration of the column control circuit of the resistive memory device according to the fourth embodiment.
Figure 14:
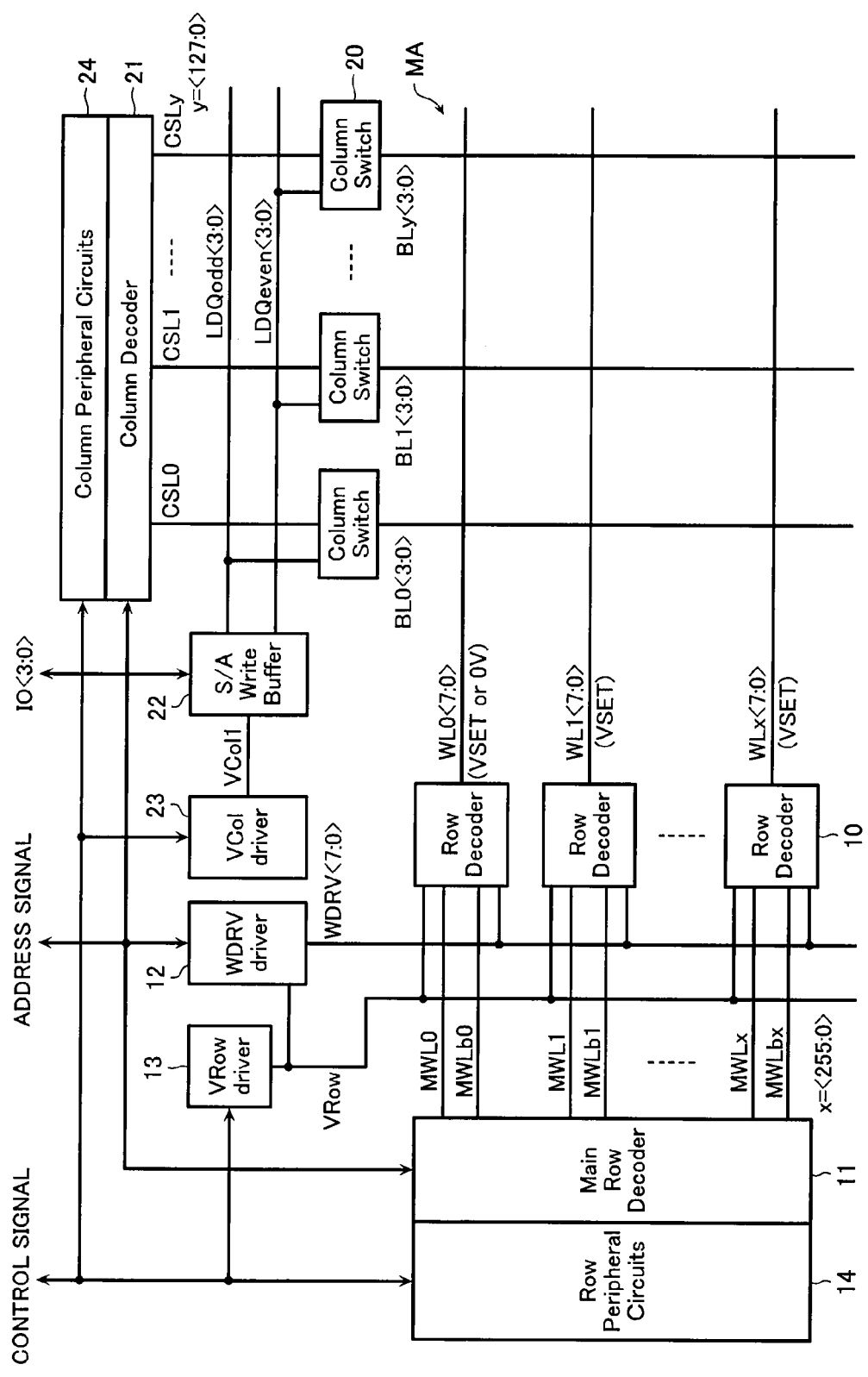
FIG. 14 is a block diagram illustrating an arrangement example of the column/row control circuits of the resistive memory device according to a fourth embodiment.
Figure 16:
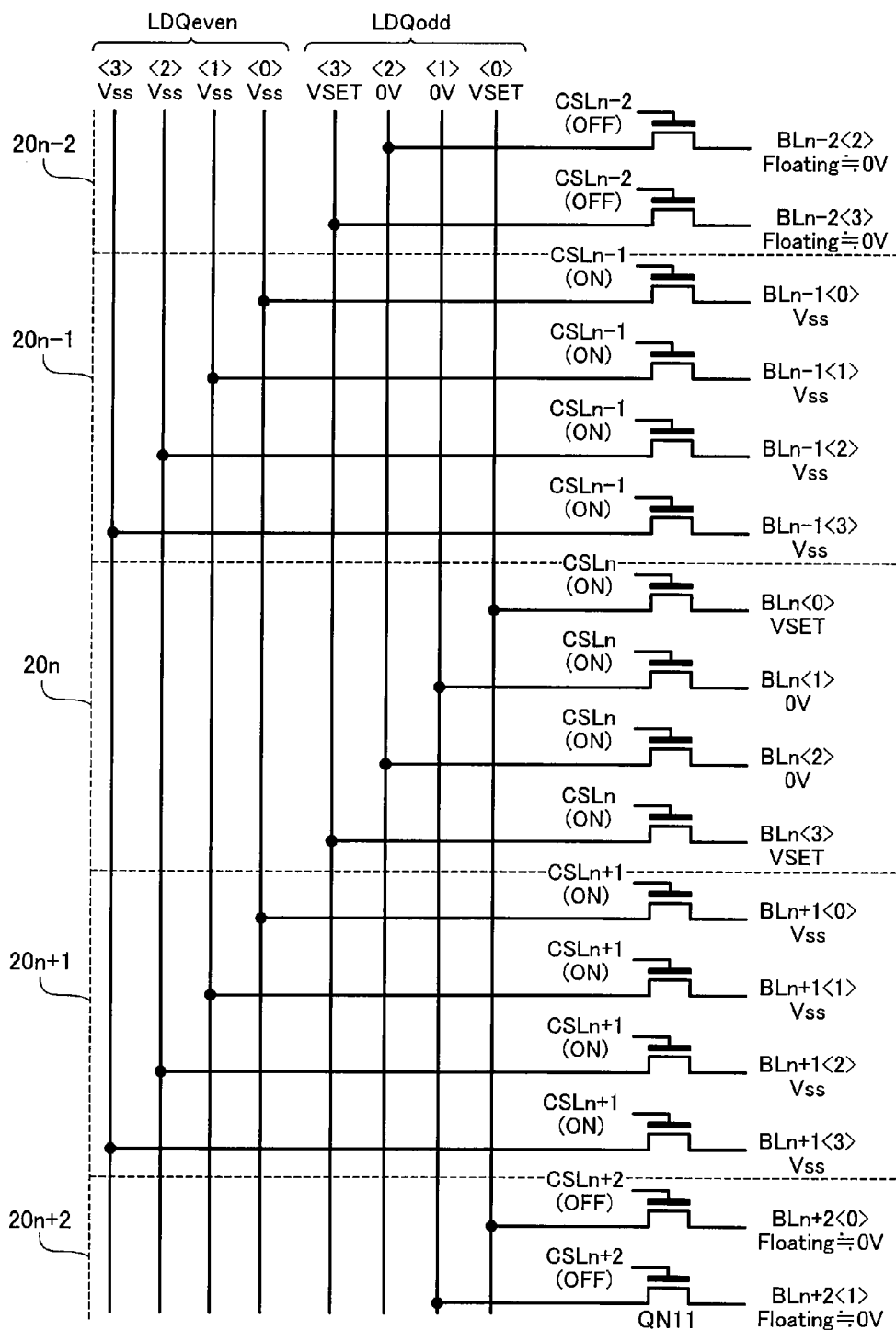
FIG. 16 is a circuit diagram illustrating an example configuration of the column control circuit of the resistive memory device according to the fourth embodiment.

The resistive memory device according to a fourth embodiment of the present invention is described below with reference to FIGS. 14 to 16. FIG. 14 is a block diagram illustrating an arrangement example of the column/row control circuits of the resistive memory device. FIGS. 15 and 16 are circuit diagrams illustrating configuration examples of the column control circuit of the resistive memory device. In the resistive memory device according to the fourth embodiment shown in FIGS. 14 to 16, the same portions as those in the first to third embodiments are denoted by the same symbols, and the description thereof is omitted.

The resistive memory device according to the fourth embodiment is different from those in the first to third embodiments in that the local data lines LDQ<3:0> which connect the sense amplifier/write buffers 22 and the column switches 20 are divided into two including the local data line LDQodd<3:0> and LDQeven<3:0>. The configuration of the column control circuit is described below with reference to FIGS. 14 to 16.

As shown in FIG. 15, the column switch 20 is connected to any one of 128 column selection lines CSLy (y=<127:0>). The column switch 20 is connected to anyone of the local data line LDQeven<3:0> or LDQodd<3:0>. The plurality of column switches 20 is connected to the local data line LDQeven<3:0> or LDQodd<3:0> alternately.

The column switches 20 are connected to the bit line groups BLy<3:0>, and the bit lines BL are connected to the plurality of memory cells MC arranged in line. The bit line group BLy<3:0> connected to one column switch 20 comprises four wirings including the bit lines BLy0 to BLy3. Similarly, the local data lines LDQeven<3:0> and LDQodd<3:0> are wirings comprising four wirings including LDQeven0 to LDQeven3 and LDQodd0 to LDQodd3. The configuration of the column switch 20 is similar to that in the second embodiment shown in FIG. 9.

FIG. 16 illustrates a detailed configuration of the column switches 20 and the local data lines LDQeven<3:0> and LDQodd<3:0>. One column switch 20 has four NMOS transistors QN11. Gates of the four transistors QN11 are connected to column selection lines CSLy (y=<127:0>), respectively. The column switch 20n is the n-th one of the 128 column switches 20.

The bit line BLn<0> is connected to a source of the transistor whose drain is connected to the local data line LDQodd<0> in the four transistors QN11 in the column switch 20. Similarly, the bit lines BLn<1>, <2> and <3> are connected to sources of the transistors whose drains are connected to the local data lines LDQodd<1>, <2> and <3>. Further, the local data line LDQeven<3:0> is connected to drains of the four transistors QN11 in the column switches 20n+1 and 20n−1 adjacent to the column switch 20n, and bit lines BLn+1 and BLn−1 are connected to sources. As a result, the column switches 20 connected to the local data lines LDQeven<3:0> and the column switches 20 connected to the local data lines LDQodd<3:0> are provided alternately, as described above.

The set operation in the resistive memory device shown in FIGS. 14 to 16 is described. It is assumed that the memory cells MC on which the set operation is performed are connected to the bit lines BLn<0> and <3>.

As shown in FIG. 16, when the set operation is performed, the sense amplifier/write buffer 22 applies a voltage VSET to the local data lines LDQodd<0> and <3>. The sense amplifier/write buffer 22 applies a ground voltage Vss=0 V to the local data lines LDQodd<1> and <2>. The sense amplifier/write buffer 22 applies a ground voltage Vss to all the local data lines LDQeven<3:0>. The column decoder 21 brings the column selection line CSLn in the column selection lines CSLy connected to the column switch 20n for selectively driving the memory cell MC on which the set operation is executed into an ON state. The column decoder 21 brings also the column selection lines CSLn+1 and CSLn−1 connected to the column switches 20n+1 and 20n−1 adjacent to the column switch 20n into the ON state. As a result, the transistors QN11 of the column switches 20n, 20n+1 and 20n−1 are conductive. The column selection lines CSLy connected to the column switches 20 other than the column switches 20n, 20n+1 and 20n−1 are brought into an OFF state.

In the column switches 20n, a voltage VSET is applied to the bit lines BLn<0> and <3> connected to the local data lines LDQodd<0> and <3> via the conductive transistors QN11. A ground voltage Vss is applied to the bit lines BLn<1> and <2> connected to the local data lines LDQodd<1> and <2>. In the column switches 20n+1 and 20n−1 adjacent to the column switch 20n, a ground voltage Vss is applied to the bit lines BLn<3:0> connected to the local data lines LDQeven<3:0> via the conductive transistors QN11. Since the column selection lines CSLy connected to the column switches 20 other than the column switches 20n, 20n+1 and 20n−1 are in the OFF state, a voltage is not applied to the bit line BL, so that they are in the floating state.

On the other hand, the word line WL01 connected to the selected memory cell MC is selectively driven by a ground voltage Vss. As a result, the diode Di of the selected memory cell MC is turned to the forward bias state, which causes current to flow therethrough. The variable resistance element VR of the selected memory cell MC is changed from the high resistance state into the low resistance state, so that the set operation is completed.

When the bit lines BL are selectively driven and a voltage VSET is applied to the selected bit line BL01, the electric potential of the adjacent nonselected bit lines BL in the floating state occasionally rises due to coupling. In this case, the set operation might be accidentally performed on the nonselected memory cells MC connected to the nonselected bit lines BL.

In the resistive memory device according to the fourth embodiment, however, the ground voltage Vss is applied to the bit line groups BLn+1<3:0> and BLn−1<3:0> connected to the column switches 20n+1 and 20n−1 adjacent to the column switch 20n. For this reason, the voltages of the bit lines BL adjacent to the selected bit line BL01 can be securely maintained at the ground voltage Vss at the time of the set operation. Due to a shield effect of the bit lines BL adjacent to the selected bit line BL01, even if the other nonselected bit lines BL are brought into the floating state, the electric potential of the nonselected bit lines BL hardly rise from the ground voltage Vss. In the resistive memory device according to the fourth embodiment, the set operation is not accidentally performed on the nonselected memory cells MC.

Also, in the resistive memory device according to the fourth embodiment, the column switch 20 can include one transistor QN11. According to this configuration, the column switch 20 selected by the column selection line CSLy can drive the bit line group BL0<3:0>. At the same time, the column switches 20 which are not selected by the column selection lines CSLy can maintain the bit line groups BLy<3:0> in the floating state. With the column switches 20 according to the fourth embodiment, the number of transistors can be reduced, and the column control circuit can be configured more simply.

The embodiments of the present invention are described above, but the present invention is not limited to them, and various changes, additions and combinations can be made without departing from the scope of the present invention. For example, the embodiments describe the operation of the resistive memory device as the set operation, but such set operation can be the reset operation which change the selected memory cell MC from the low resistant state into the high resistant state or the reading operation by adjusting a voltage and an electric current to be applied to the memory cells MC, and voltage applying time. Further, in the embodiments, the bit lines group BLy<3:0> comprises four wirings, and the word line group WLx<7:0> comprises eight wirings. The number of bit lines BL and word lines WL included in the bit line group and the word line group can be changed according to designs of the resistive memory device.

What is claimed is:
1. A semiconductor storage device comprising:
a memory cell array having memory cells positioned at respective intersections between a plurality of first wirings and a plurality of second wirings, each of the memory cells having a variable resistance element;
a write buffer configured to apply a first voltage or a second voltage to local data lines selectively;
a plurality of column switches, each of the column switches being connected between the first wirings and the local data lines; and
a column decoder configured to select one of the column switches as a selected column switch,
the write buffer configured to apply the first voltage to a selected local data line and to apply the second voltage to nonselected local data lines, and
the selected column switch configured to apply the first voltage from the selected local data line to one of the first wirings.
2. The semiconductor storage device according to claim 1, wherein each of the column switches includes a plurality of first transistors, each of the first transistors is connected between one of the first wirings and one of the selected or nonselected local data lines, and the column decoder selects the selected column switch by turning on the first transistors in the selected column switch.

3. The semiconductor storage device according to claim 2, wherein the column decoder selects some of the column switches as nonselected column switches by turning off the first transistors in the nonselected column switches.

4. The semiconductor storage device according to claim 3, wherein the first wirings connected to the nonselected column switches are in a floating state.

5. The semiconductor storage device according to claim 2, wherein the selected column switch applies the second voltage from each of the nonselected local data lines to one of the first wirings connected to the selected column switch.

6. The semiconductor storage device according to claim 4, wherein the selected column switch applies the second voltage from each of the nonselected local data lines to one of the first wirings connected to the selected column switch.

7. The semiconductor storage device according to claim 1, wherein a number of the selected and nonselected local data lines is equal to a total number of the first wirings connected to one of the column switches.

8. The semiconductor storage device according to claim 1, further comprising a row decoder configured to apply a third voltage to one of the second wirings and apply a fourth voltage to the other second wirings.

9. The semiconductor storage device according to claim 8, wherein a voltage value of the first voltage is equal to a voltage value of the fourth voltage.

10. The semiconductor storage device according to claim 9, wherein a voltage value of the second voltage is equal to a voltage value of the third voltage.

11. The semiconductor storage device according to claim 8, wherein a voltage value of the first voltage is higher than a voltage value of the second voltage.

12. The semiconductor storage device according to claim 11, wherein a voltage value of the fourth voltage is higher than a voltage value of the third voltage.

* * * * *